(12) United States Patent
Tung et al.

(10) Patent No.: US 11,105,692 B2
(45) Date of Patent: Aug. 31, 2021

(54) FORCE SENSOR HAVING FIRST AND SECOND CIRCUIT BOARD ARRANGEMENTS

(71) Applicant: Coretronic MEMS Corporation, Hsinchu County (TW)

(72) Inventors: Hsi-Wen Tung, Taipei (TW); Wen-Pin Tsai, New Taipei (TW); Ming-Ching Wu, Taoyuan (TW)

(73) Assignee: CORETRONIC MEMS CORPORATION, Miaoli County (TW)

( * ) Notice: Subject to any disclaimer, the term of this patent is extended or adjusted under 35 U.S.C. 154(b) by 314 days.

(21) Appl. No.: 16/354,205

(22) Filed: Mar. 15, 2019

(65) Prior Publication Data
US 2020/0240856 A1 Jul. 30, 2020

(30) Foreign Application Priority Data

Jan. 24, 2019 (TW) .................. 108102624

(51) Int. Cl.
*G01L 1/18* (2006.01)
*G01L 1/22* (2006.01)
(Continued)

(52) U.S. Cl.
CPC .............. *G01L 1/18* (2013.01); *G01L 1/2293* (2013.01); *G01L 1/26* (2013.01); *G01L 5/162* (2013.01);
(Continued)

(58) Field of Classification Search
None
See application file for complete search history.

(56) References Cited

U.S. PATENT DOCUMENTS 8,650,345 B2* 2/2014 Ranta .................... G06F 3/0238
710/73
9,945,747 B1* 4/2018 Kusanale ............ G01L 19/0627
(Continued)

FOREIGN PATENT DOCUMENTS

CN 101308802 11/2008
CN 105129720 12/2015
(Continued)

OTHER PUBLICATIONS

"Office Action of Taiwan Counterpart Application," dated Sep. 10, 2019, pp. 1-6.
(Continued)

*Primary Examiner* — Andre J Allen
*Assistant Examiner* — Jermaine L Jenkins
(74) *Attorney, Agent, or Firm* — JCIPRNET

(57) ABSTRACT

A force sensor includes a sensing element, a first circuit board, and at least one second circuit board. The sensing element has a top surface and the bottom surface opposite to each other and has a sensing portion, wherein the sensing portion is located at the top surface. The first circuit board is disposed on the top surface and is electrically connected to the sensing element. The at least one second circuit board is connected to the first circuit board, wherein the at least one second circuit board shields the sensing element. The sensing portion is adapted to generate a sensing signal through an external force transferred from the first circuit board to the top surface.

10 Claims, 3 Drawing Sheets

(51) Int. Cl.
*G01L 5/162* (2020.01)
*G01L 1/26* (2006.01)

(52) U.S. Cl.
CPC ............ *B81B 2201/0264* (2013.01); *B81B 2201/0292* (2013.01)

(56) References Cited

U.S. PATENT DOCUMENTS

| | | | |
|---|---|---|---|
| 10,067,014 B1 * | 9/2018 | Tung | G01L 1/26 |
| 10,481,024 B2 * | 11/2019 | Wade | A61M 5/16831 |
| 2010/0100052 A1 * | 4/2010 | Eckhardt | G01L 1/2231 604/181 |
| 2014/0007705 A1 | 1/2014 | Campbell et al. | |
| 2017/0176278 A1 * | 6/2017 | Chen | G01L 9/0054 |
| 2017/0234744 A1 | 8/2017 | Tung et al. | |
| 2018/0313709 A1 | 11/2018 | Chiou | |

FOREIGN PATENT DOCUMENTS

| | | |
|---|---|---|
| CN | 108534924 | 9/2018 |
| CN | 207908088 | 9/2018 |
| CN | 1086455548 A | 10/2018 |
| TW | 500914 | 9/2002 |
| TW | I258868 | 7/2006 |
| TW | 201036120 | 10/2010 |
| TW | I593066 | 7/2017 |
| TW | I627391 | 6/2018 |

OTHER PUBLICATIONS

Office Action of China Counterpart Application, dated Apr. 22, 2021, pp. 1-7.

* cited by examiner

FORCE SENSOR HAVING FIRST AND SECOND CIRCUIT BOARD ARRANGEMENTS

CROSS-REFERENCE TO RELATED APPLICATION

This application claims the priority benefit of Taiwan application serial no. 108102624, filed on Jan. 24, 2019. The entirety of the above-mentioned patent application is hereby incorporated by reference herein and made a part of this specification.

BACKGROUND

Technical Field

The invention relates to a sensor, and particularly relates to a force sensor.

Description of Related Art

Micro-Electro-Mechanical System (MEMS) technology is a design based on a miniaturized electromechanical integrated structure. The commonly used MEMS technology is mainly used in three fields: micro sensors, micro actuators and micro structures, where the micro sensors may convert external environmental changes (such as changes of a force, a pressure, a sound, a speed, etc.) into electrical signals (such as voltages or currents) to achieve environmental sensing functions, such as force sensing, pressure sensing, sound sensing, acceleration sensing, etc. Since the micro sensors may be manufactured by using a semiconductor process technology and integrated with integrated circuits, the micro sensors have better competitiveness. Therefore, the MEMS sensors and the sensing devices using the MEMS sensors are a development trend of the MEMS.

Taking a MEMS force sensor as an example, a housing is generally added to protect a sensing element in the force sensor and enhance an overall structural strength of the force sensor, so as to avoid a situation that the sensing element is exposed and directly withstand a pressing force to cause damage of the sensing element. However, if a cover is added to cover the sensing element in order to solve the above problem, an overall thickness and manufacturing cost of the sensor are increased. Therefore, how to protect and maintain a sensing performance of the sensing element of the force sensor without increasing the overall thickness and manufacturing cost of the force sensor is an important issue in the field of the MEMS force sensor.

SUMMARY

The invention is directed to a force sensor, in which sensing elements thereof are well protected and have good sensing performance.

The invention provides a force sensor including a sensing element, a first circuit board, and at least one second circuit board. The sensing element has a top surface and a bottom surface opposite to each other and has a sensing portion, wherein the sensing portion is located at the top surface. The first circuit board is disposed on the top surface and is electrically connected to the sensing element. The at least one second circuit board is connected to the first circuit board, wherein the at least one second circuit board shields the sensing element. The sensing portion is adapted to generate a sensing signal through an external force transferred from the first circuit board to the top surface.

In an embodiment of the invention, the sensing element and the at least one second circuit board are located at a same side of the first circuit board.

In an embodiment of the invention, the at least one second circuit board surrounds the sensing element.

In an embodiment of the invention, the force sensor further includes a first gel material, wherein the first gel material is filled between the first circuit board, the at least one second circuit board and the sensing element, and covers the sensing element.

In an embodiment of the invention, the force sensor further includes a second gel material, wherein the first circuit board has an opening. The sensing portion is aligned with the opening. The second gel material is at least partially disposed in the opening and covers the sensing portion. The second gel material is adapted to receive the external force.

In an embodiment of the invention, the second gel material protrudes from the opening.

In an embodiment of the invention, the force sensor further includes at least one conductive bump, wherein the at least one conductive bump is disposed between the top surface and the first circuit board. The sensing element is electrically connected to the first circuit board through the at least one conductive bump.

In an embodiment of the invention, the force sensor further includes at least one third gel material, wherein the third gel material surrounds the at least one conductive bump.

In an embodiment of the invention, the first circuit board has a first circuit, and is electrically connected to the sensing element through the first circuit. The at least one second circuit board has a second circuit. One end of the second circuit is connected to the first circuit. Another end of the second circuit extends to an end of the at least one second circuit board to construct an electrical contact.

In an embodiment of the invention, the force sensor further comprises a signal processing unit, wherein the signal processing unit is arranged on the first circuit board and is electrically connected to the sensing element through the first circuit board.

Based on the above description, the force sensor of the invention has the first circuit board and the second circuit board, and the sensing element is connected to the first circuit board and is shielded by the second circuit board, so that the first circuit board and the second circuit board provide the force sensor with a good structural strength and protect the sensing element therein.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
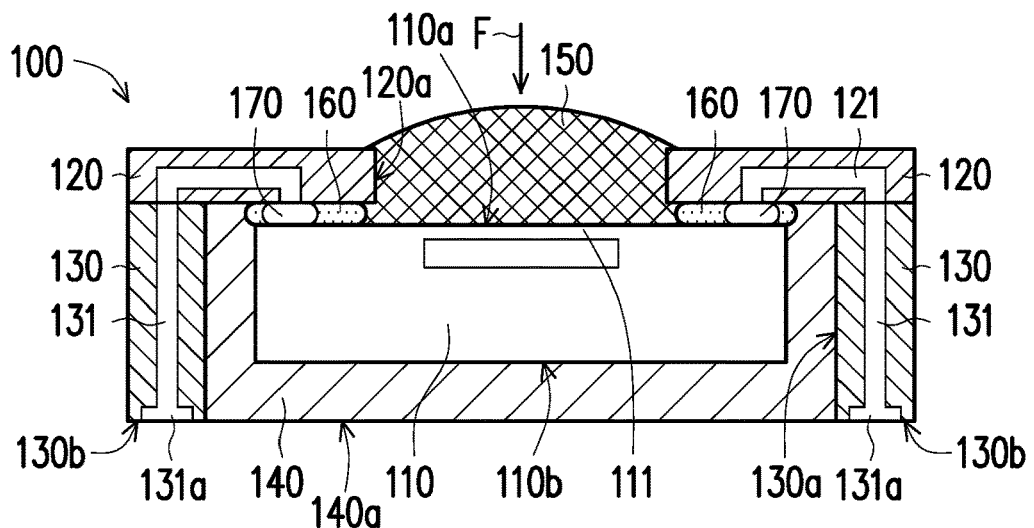
FIG. 1 is a cross-sectional view of a force sensor according to an embodiment of the invention.

FIG. 1 is a cross-sectional view of a force sensor according to an embodiment of the invention. Referring to FIG. 1, the force sensor 100 of the embodiment is, for example, an MEMS force sensor and includes a sensing element 110, a first circuit board 120, at least one second circuit board 130, a first gel material 140, a second gel material 150, a third gel material 160 and at least one conductive bump 170. The sensing element 110 has a top surface 110a and a bottom surface 110b opposite to each other and has a sensing portion 111, and the sensing portion 111 is located at the top surface 110a. The sensing element 110 may be a piezoresistive sensing element, a capacitive sensing element, or other proper types of sensing element, which is not limited by the invention. The first circuit board 120 is disposed on the top surface 110a and is electrically connected to the sensing element 110 through the at least one conductive bump 170.

The at least one second circuit board 130 is connected to the first circuit board 120, and the at least one second circuit board 130 and the sensing element 110 are located at a same side of the first circuit board 120. The at least one second circuit board 130 constructs a recess 130a. The sensing element 110 is located in the recess 130a and is shielded by the at least one second circuit board 130. In the embodiment, the number of the second circuit board 130 is one, and the second circuit board 130 surrounds the sensing element 110 and constructs the recess 130a used for containing the sensing element 110. The first gel material 140 is filled in the recess 130a. In detail, the first gel material 140 is filled between the first circuit board 120, the at least one second circuit board 130 and the sensing element 110, and covers the sensing element 110. In some embodiments, the number of the second circuit boards may be plural, and these second circuit boards are patched together to form the recess, and the sensing element is located in the recess, such that the second circuit boards surround the sensing element, though the invention is not limited thereto.

The first circuit board 120 has an opening 120a. The sensing portion 111 of the sensing element 110 is aligned with the opening 120a. The second gel material 150 is filled in the opening 120a, and protrudes out of the first circuit board 120 from the opening 120a. The sensing portion 111 is adapted to receive an external force F transferred from the second gel material 150 to the top surface 110a to make the sensing element 110 to generate a sensing signal. The first circuit board 120 has a first circuit 121. The at least one second circuit board 130 has a second circuit 131. One end of the second circuit 131 is connected to the first circuit 121. Another end of the second circuit 131 extends to an end 130b of the at least one second circuit board 130 to construct an electrical contact 131a. The sensing element 110 is electrically connected to the first circuit 121 in the first circuit board 120 through the at least one conductive bump 170. Namely, the sensing signal generated by the sensing element 110 may be transmitted to the electrical contact 131a at the end 130b of the at least one second circuit board 130 through the first circuit 121 and the second circuit 131. The at least one second circuit board 130 may be connected to other devices to integrate the sensing signal generated by the sensing element 110 with functions of the other devices. The force sensor 110 may be applied to a device with a touch function, so that the force sensing function of the force sensor 110 may be used for determining a touch force of the user. However, the invention is not limited thereto, the force sensor 100 may also be applied to other types of devices.

The sensing element 110 is, for example, a piezoresistive sensor, and a material of a main body thereof is, for example, silicon, and the sensing portion 111 thereon is arranged with a piezoresistive material, where the piezoresistive material is electrically connected to the corresponding at least one conductive bump 170.

In the embodiment, the third gel material 160 surrounds the at least one conductive bump 170, and a purpose thereof is to protect the conductive bumps 170 to ensure bonding between the sensing element 110 and the first circuit 131, so as to prevent the conductive bumps 170 from falling during and manufacturing and using processes to cause failure of the force sensor 100. In this way, in the force sensor 100, the first gel material 140, the second gel material 150 and the third gel material 160 are used to completely surround the sensing element 110, such that the sensing element 110 is well protected, so as to prevent the sensing element 110 from contacting vapor and dust of an external environment to reduce sensitivity of the force sensor 100.

In the embodiment, a material of the second gel material 150 may be different from that of the first gel material 140 and the third gel material 160. A hardness of the first gel material 140 and the third gel material 160 is, for example, larger than a hardness of the second gel material 150, and the second encapsulate 150 is softer and has better elastic deformation ability, so as to effectively transfer the external force to the sensing portion 111 of the sensing element 110. Moreover, the first gel material 140 and the third gel material 160 with the larger hardness may stably surround the sensing element 110 and the at least one conductive bump 170 and increase a structural strength of the force sensor 100. In other embodiments, the material of the second gel material 150 may be the same with that of the first gel material 140 and the third gel material 160, which is not limited by the invention. The first gel material 140, the second gel material 150 and the third gel material 160 may be heat curing gels, light curing gels or other proper types of gels, which are not limited by the invention.

It should be noted that a surface 140a of the first gel material 140 located away from the first circuit board 120 is adapted to align with the end 130b of the second circuit board 130 or recessed relative to the end 130b, and a purpose thereof is to facilitate electrical connection between the electrical contact 131a on the end 130b and an external device outside the force sensor 100. A mold may be used to form the first gel material 140 to achieve the above effect, or after the first gel material 140 is formed, a surface grinding process (for example, a chemical mechanical grinding process) is adopted to achieve the above effect, which is not limited by the invention.

In the aforementioned force sensor 100, by configuring the first circuit board 120 and the second circuit board 130 around the sensing element 110, a whole structural strength of the force sensor 100 is enhanced, so that it is unnecessary to additionally arrange a housing to protect the force sensor 100, so as to reduce the manufacturing cost.

Figure 2:
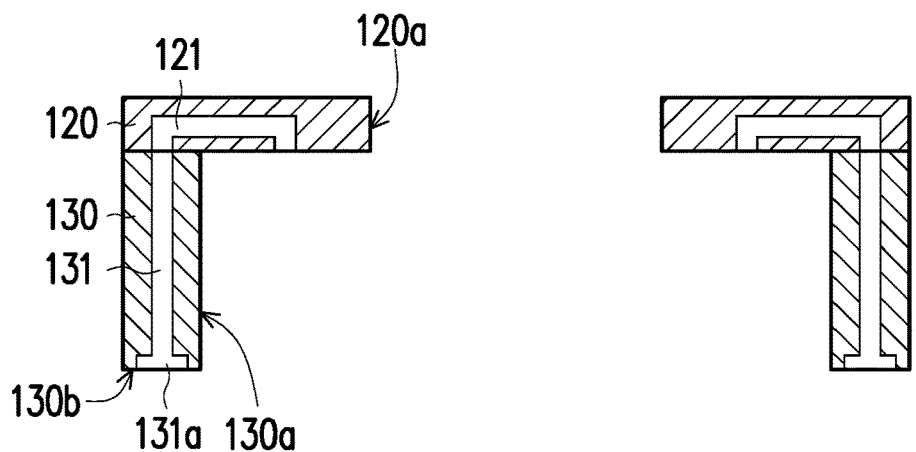
FIG. 2 to FIG. 5 are cross-sectional views of manufacturing processes of a force sensor according to an embodiment of the invention.
Figure 3:
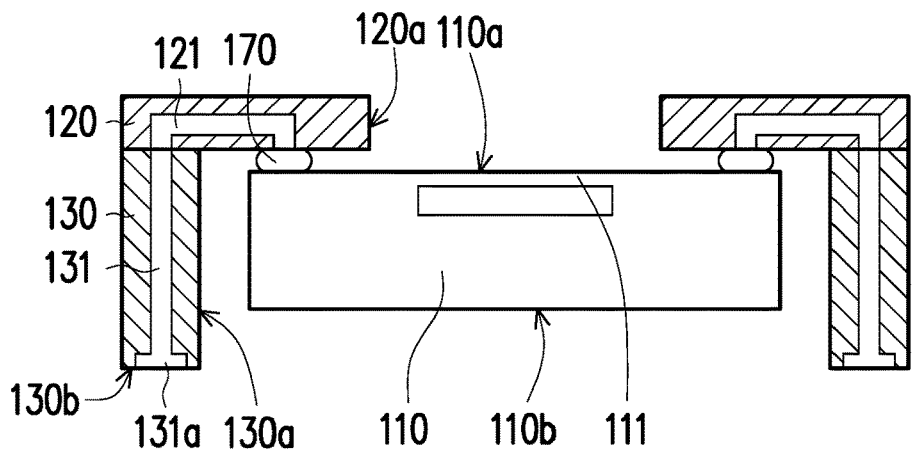

A detailed manufacturing process of the force sensor is described below. FIG. 2 to FIG. 5 are cross-sectional views of a manufacturing process of a force sensor according to an embodiment of the invention. Referring to FIG. 2 first, the first circuit board 120 and the at least one second circuit board 130 are connected to each other, and the first circuit 121 in the first circuit board 120 and the second circuit 131 in the at least one second circuit board 130 are electrically connected. It should be noted that the opening 120a formed on the first circuit board 120 is connected with the recess 130a formed by the at least one second circuit board 130. Moreover, the first circuit board 120 further has plurality of contacts of the first circuit 121 in the recess 130a to facilitate electrical connection between the first circuit board 120 and the subsequently arranged sensing element 110 (FIG. 3).

Referring to FIG. 3, the conductive bumps 170 are formed on the top surface 110a of the sensing element 110 in the recess 130a in a solder bonding manner to electrically connect the sensing element 110 with the first circuit 121 of the first circuit board 120. The conductive bumps 170 may also be formed on the top surface 110a of the sensing element 110 in an electroplating, printing, or ball planting manner, and are then electrically connected with the first circuit 121 of the first circuit board 120, which is not limited by the invention. Moreover, the sensing portion 111 of the sensing element 110 is aligned with the opening 120a. It should be noted that a distance between the end 130b of the at least one second circuit board 130 with the electrical contact 131a and the first circuit board 120 is greater than a distance between the bottom surface 110b of the sensing element 110 and the first circuit board 120, such that the sensing element 110 may be completely located in the recess 130a and shielded by the at least one second circuit board 130.

Figure 4:
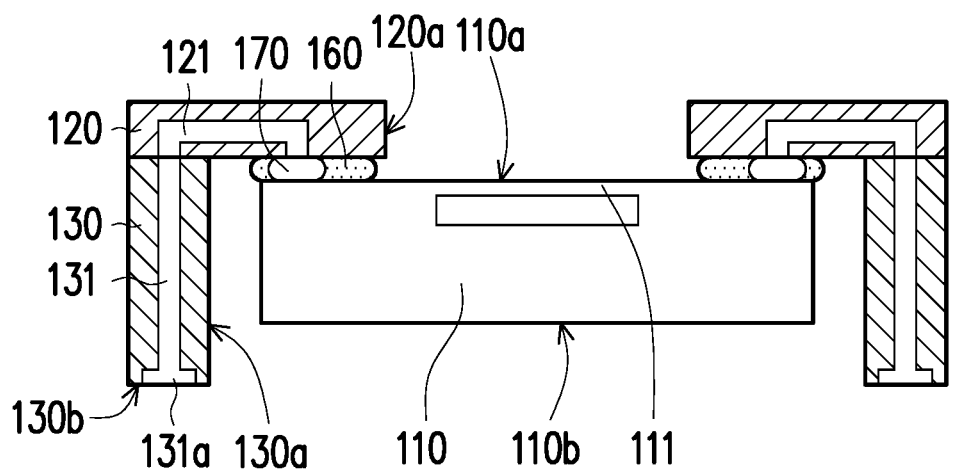

Referring to FIG. 4, in order to protect the conductive bumps 170 from being affected by the subsequent manufacturing process to cause a damage and in order to stabilize bonding between the first circuit board 120 and the sensing element 110, the third gel material 160 is, for example, formed in a dispensing manner to surround the at least one conductive bump 170.

Figure 5:
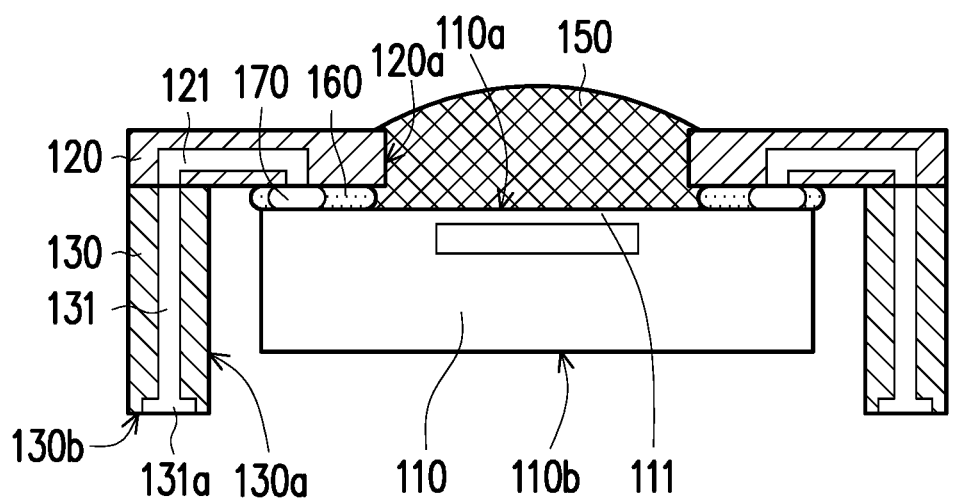

Referring to FIG. 5, the second gel material 150 is filled in the opening 120a. The second gel material 150 is, for example, formed through dispensing or injection molding, and is completely filled in the opening 120a. A top portion of the second gel material 150 is adapted to receive a force (indicated as the external force F) to make the second gel material 150 to produce an elastic deformation as that shown in FIG. 1, and the sensing element 110 is adapted to sense the elastic deformation of the second gel material 150 to generate a sensing signal. Meanwhile, the second gel material 150 protrudes out of the first circuit board 120 to adapt to receive the external force.

Then, referring back to FIG. 1, the first gel material 140 is, for example, filled in the recess 130a formed by the at least one second circuit board 130 in the injection molding manner, and completely covers the sensing element 110. Through the above steps, a full configuration of the force sensor 100 is completed.

Figure 6:
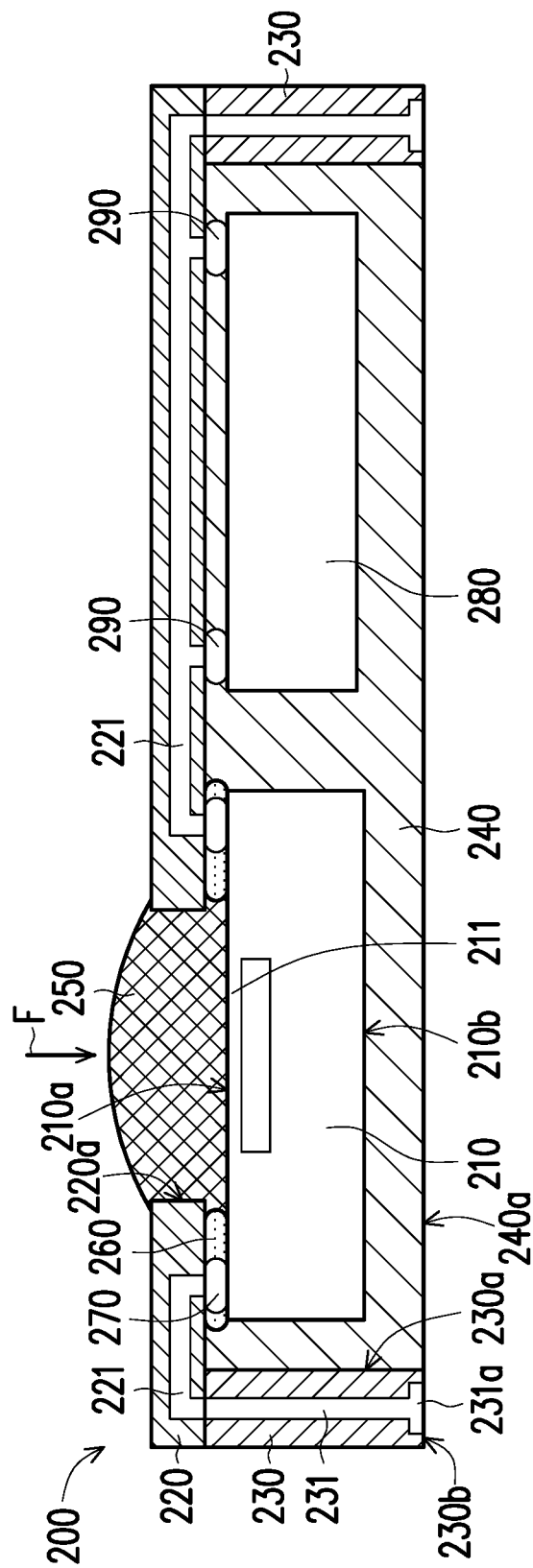
FIG. 6 is a cross-sectional view of a force sensor according to another embodiment of the invention.

FIG. 6 is a cross-sectional view of a force sensor according to another embodiment of the invention. Configuration and functions of a sensing element 210, a top surface 210a, a bottom surface 210b, a sensing portion 211, a first circuit board 220, an opening 220a, a first circuit 221, at least one second circuit board 230, a recess 230a, an end 230b, a second circuit 231, an electrical contact 231a, a first gel material 240, a surface 240a, a second gel material 250, a third gel material 260 and first conductive bumps 270 of the force sensor 200 are similar to the configuration and functions of the sensing element 110, the top surface 110a, the bottom surface 110b, the sensing portion 111, the first circuit board 120, the opening 120a, the first circuit 121, the at least one second circuit board 130, the recess 130a, the end 130b, the second circuit 131, the electrical contact 131a, the first gel material 140, the surface 140a, the second gel material 150, the third gel material 160 and the conductive bumps 170 of FIG. 1, and details thereof are not repeated. Differences between the force sensor 200 and the force sensor 100 are as follows. The force sensor 200 further includes a signal processing unit 280, and when the first circuit board 220 is bonded with the at least one second circuit board 230, a space is reserved in the recess 230a, such that the signal processing unit 280 is disposed at a same side of the first circuit board 220 with the sensing element 210, and meanwhile shielded by the at least one second circuit board 230. Moreover, the first circuit board 220 reserves a plurality of contacts of the first circuit 221, by which besides that the first circuit board 220 is electrically connected to the sensing element 210 through the at least one first conductive bump 270, the signal processing unit 280 may also be electrically connected to the first circuit 221 of the first circuit board 220 through at least one second conductive bump 290. The first gel material 240 also surrounds the signal processing unit 280. The sensing signal coming from the sensing portion 211 of the sensing element 210 may be transmitted to the signal processing unit 280 through the first circuit 221 in the first circuit board 220, and the signal processing unit 280 processes (for example, convert or filter a noise of) the sensing signal, and is connected to other electronic devices through the second circuit 231.

In summary, in the force sensor of the invention, the sensing element is accommodated in the space formed by the first circuit board and the second circuit board, so as to provide the force sensor with good structural strength and meanwhile provide the electrical connection between the sensing element and other electronic devices. Moreover, by using the first gel material, the second gel material and the third gel material to surround the sensing element, the sensing element is well protected, so as to avoid exposing the sensing element to cause damage. Based on the elastic deformation characteristic of the second gel material protruding out of the opening of the first circuit board, a pressing force exerted on the second gel material may be fluently transmitted to the sensing element along with deformation of the second gel material, such that the sensing element may accurately sense the pressing force.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A force sensor, comprising:
    a sensing element, having a top surface and a bottom surface opposite to each other and having a sensing portion, wherein the sensing portion is located at the top surface;
    a first circuit board, disposed on the top surface and electrically connected to the sensing element; and
    at least one second circuit board, connected to the first circuit board, wherein the at least one second circuit board shields the sensing element,
    at least one conductive bump, wherein the at least one conductive bump is disposed between the top surface and the first circuit board, and the sensing element is electrically connected to the first circuit board through the at least one conductive bump,
    wherein the sensing portion is adapted to generate a sensing signal through an external force to the top surface.

2. The force sensor as claimed in claim 1, wherein the sensing element and the at least one second circuit board are located at a same side of the first circuit board.

3. The force sensor as claimed in claim 1, wherein the at least one second circuit board surrounds the sensing element.

4. The force sensor as claimed in claim 1, further comprising a first gel material, wherein the first gel material is filled between the first circuit board, the at least one second circuit board and the sensing element, and covers the sensing element.

5. The force sensor as claimed in claim 1, further comprising a second gel material, wherein the first circuit board has an opening, the sensing portion is aligned with the opening, the second gel material is at least partially disposed in the opening and covers the sensing portion, and the second gel material is adapted to receive the external force.

6. The force sensor as claimed in claim 5, wherein the second gel material protrudes from the opening.

7. The force sensor as claimed in claim 1, further comprising at least one third gel material, wherein the third gel material surrounds the at least one conductive bump.

8. The force sensor as claimed in claim 1, wherein the first circuit board has a first circuit, and is electrically connected to the sensing element through the first circuit, the at least one second circuit board has a second circuit, one end of the second circuit is connected to the first circuit, and another end of the second circuit extends to an end of the at least one second circuit board to construct an electrical contact.

9. The force sensor as claimed in claim 1, further comprising a signal processing unit, wherein the signal processing unit is arranged on the first circuit board and is electrically connected to the sensing element through the first circuit board.

10. A force sensor, comprising:
a sensing element, having a top surface and a bottom surface opposite to each other and having a sensing portion, wherein the sensing portion is located at the top surface;
a first circuit board, disposed on the top surface and electrically connected to the sensing element;
at least one second circuit board, connected to the first circuit board, wherein the at least one second circuit board shields the sensing element; and
a second gel material, wherein the first circuit board has an opening, the sensing portion is aligned with the opening, the second gel material is at least partially disposed in the opening and covers the sensing portion, and the second gel material is adapted to receive the external force,
wherein the sensing portion is adapted to generate a sensing signal through an external force transferred from the second gel material to the top surface.

* * * * *